United States Patent
Fusegawa et al.

(10) Patent No.: US 6,387,466 B1
(45) Date of Patent: May 14, 2002

(54) SINGLE-CRYSTAL SILICON WAFER

(75) Inventors: Izumi Fusegawa; Masakazu Sato, both of Nishigo-mura (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 09/429,343

(22) Filed: Oct. 28, 1999

(30) Foreign Application Priority Data

Oct. 29, 1998 (JP) ............................................. 10-309161

(51) Int. Cl.⁷ ............................. B32B 3/02; C30B 15/00
(52) U.S. Cl. ..................... 428/64.1; 117/19; 117/13; 117/21; 117/36; 117/20; 117/917
(58) Field of Search ..................... 428/64.1; 117/19, 117/13, 21, 36, 20, 917

(56) References Cited

U.S. PATENT DOCUMENTS

| | | | |
|---|---|---|---|
| 4,181,538 A | * | 1/1980 | Narayan et al. |
| 5,248,378 A | * | 9/1993 | Oda et al. |
| 5,373,804 A | * | 12/1994 | Tachimori et al. |
| 5,386,796 A | * | 2/1995 | Fusegawa et al. |
| 5,704,987 A | * | 1/1998 | Huynh et al. |
| 5,779,791 A | * | 7/1998 | Korb et al. |
| 5,834,322 A | * | 11/1998 | Fusegawa et al. |
| 5,919,302 A | * | 7/1999 | Falster et al. |
| 5,935,320 A | * | 8/1999 | Graef et al. |
| 5,946,543 A | * | 8/1999 | Kimura et al. |
| 6,059,875 A | * | 5/2000 | Kirkland et al. |
| 6,129,787 A | * | 10/2000 | Adachi et al. |
| 6,236,104 B1 | * | 5/2001 | Falster |

FOREIGN PATENT DOCUMENTS

| | | |
|---|---|---|
| JP | 8-066 850 | 3/1996 |
| JP | 08264611 A | * 10/1996 |
| JP | 9-026 314 | 1/1997 |
| JP | 9-248 758 | 9/1997 |
| JP | 09260447 A | * 10/1997 |

* cited by examiner

Primary Examiner—Blaine Copenheaver
Assistant Examiner—Hai Vo
(74) Attorney, Agent, or Firm—Crowell & Moring LLP

(57) ABSTRACT

The high quality silicon wafer of large diameter is invented by mainly paying attention to the particles ascribed to the crystal and the wafer is optimal for manufacturing ultra highly integrated devices. The silicon wafer is of diameter of 300 mm and larger sliced from a single-crystal silicon ingot pulled by CZ method, the surface is mirror-polished and cleaned with ammonia based cleaning solution, and the number of particles of 0.083 $\mu$m and larger in size detected on its main surface is 120 and smaller and/or particles of 0.090 $\mu$m and larger in size is smaller than 80.

6 Claims, 2 Drawing Sheets

SINGLE-CRYSTAL SILICON WAFER

BACKGROUND OF THE INVENTION

1. Field of the Invention

The present invention relates to a single-crystal silicon wafer for semiconductor device produced by the so-called CZ method, the Czochralski method, in which silicon is melted in a crucible and single-crystal silicon is pulled, more specifically, to a silicon wafer of large diameter and high quality optimal for producing an ultra highly integrated device.

2. Description of the Related Art

Conventionally, a single-crystal silicon substrate processed from a single-crystal silicon and used for a semiconductor device of which the scale of integration is ever enlarging and accordingly the more minute design rules is being required has been manufactured by the Czochralski method (CZ method) which is advantageous for obtaining a large diameter silicon wafer. Especially, the scale of integration of a DRAM increases by four times and the size of a chip by one and a half times every three years. Therefore, a wafer of larger diameter is required in addition of more minute design rules to evade the reduction in chip yields per wafer and reduce the chip cost.

To meet the demand for larger chip size, single-crystal silicon wafers of large diameter of 300 mm are required (NIKKEI MICRODEVICES, November 1992) and at the same time improvements in surface flatness and surface roughness and reductions in heavy metal impurities, micro defects, and/or foreign matters on the surface are required.

Micro defects and foreign matters on the surface of a wafer can be detected together optically and these are grasped as particles and considered as an extremely important factor for quality design.

It is required for a wafer of diameter of 300 mm for a semiconductor device with 0.18 $\mu$m design rules to reduce the number of particles of 0.09 $\mu$m and larger in size detected optically to 100 and smaller. A semiconductor device undergoes multiple manufacturing processes and monitoring of adherence of particles and heavy metal impurities is necessary in process control. A single-crystal silicon of extremely low particle level is necessary as process monitor.

For the realization of particle level reduction necessitated as mentioned above, reduction in the particles ascribable to crystal, which particles are micro defects formed due to thermal history in the manufacturing process of single-crystal silicon, is an important problem to be challenged.

When a silicon wafer sliced from a single-crystal silicon ingot is cleaned with ammonia based cleaning and/or in the process afterward, there develop on the wafer etch pits and these pits will be detected optically as particles and also induce problems in the process making device as so-called particles.

These particles are generated owing to thermal condition and others in pulling the crystal and are called COP or Crystal Originated Particles (Jpn. J. Appl. Phys. 29(1990) L1947–L1949).

Furthermore, although measures are taken for prevention of micro defects due to processing in the mirror-polishing process of the surface of a wafer and of adherence of minute foreign matter and/or impurities in the processes afterward, yet it has not been possible to reduce the number of particles of 0.09 $\mu$m and larger in size to 100 and smaller by conventional arts.

Main manufacturing processes relating to quality factors required from the market of silicon wafer as mentioned above are as diverse as the pulling process of crystal in the case of larger diameter of silicon ingot; slicing, lapping, and polishing processes in relation to flatness; etching and polishing processes in relation to surface roughness; crystal pulling, slicing, lapping, polishing, and cleaning process in relation to defects on the surface including particle problem; and crystal pulling, slicing, lapping, polishing, and cleaning processes in relation to contamination of the surface, especially contamination with heavy metals.

About the particle problem on the surface, solution of which is the object of the present invention, there are cause ascribable to crystal and cause ascribable to the processing of a wafer, as mentioned above to some extent. Although reduction of particles ascribable to the processing of a wafer is extremely important and the study for its improvement has been considered as a matter of course, reduction of defects in a single-crystal, as raw material, is fundamentally important for the reduction of particles. Unless this reduction is not achieved, the object cannot be attained even by how much processes afterward are improved.

Until now, a way to find a breakthrough to reduce the particles ascribed to crystal has not been found, and no clue to solve the problem has been obtained.

SUMMARY OF THE INVENTION

The present invention aims, mainly by paying attention to the particles ascribed to crystal, to obtain a high quality silicon wafer of large diameter optimal to manufacture an ultra highly integrated device.

The present invention provides a silicon wafer of diameter of 300 mm and larger sliced from a single-crystal silicon ingot pulled by CZ method, on the main surface of which wafer are detected 120 and smaller number of particles of 0.083 $\mu$m and larger in size and/or 80 and smaller number of particles of 0.09 $\mu$m and larger in size after mirror-polished and cleaned with ammonia based cleaning solution.

As mentioned above, the limit number of particles on the surface of a wafer is determined by the design quality specification taking into consideration the processes afterward, and with 0.18 $\mu$m design rules (line width of circuit pattern on a device) the number of particles of 0.09 $\mu$m and larger is in size required to be equal to or smaller than 100 per wafer.

The number of particles per chip differs according to individual device. For example, in the case of a DRAM with 0.18 $\mu$m design rules, about 400 IC chips are obtained from a wafer of a diameter of 300 mm, and to secure the desired IC chip yields the number of particle of 0.090 $\mu$m and larger in size is required to be 0.2~0.3 or smaller per chip.

Conspicuous improvement in chip yields can be expected by the reduction of particles on a wafer.

As there are, as mentioned above, two groups of factors which effect particles, it is necessary for clarification of the result of improvement in the number of particles ascribable to crystal, which improvement is the main object of the present invention, to investigate the influence of affecting group of factors independently. The most desirable method is to separately detect the particles due to both factors and obtain each number of particles, which is impossible with the present technology.

The present invention provides a way for determining the effect of improvement in crystal, in which the standard method which has reached a state of practicability in processing a silicon ingot of large diameter is defined so that the number of particles due to the processing is a certain stable value. Wafers processed by said standard method and having a certain stable number of particles due to the processing and some unknown number of particles ascribable to the crystal are detected to obtain the sum of the number of these particles.

Current manufacturing method of a semiconductor wafer comprises; slicing process in which a single-crystal ingot pulled by the pulling apparatus of the Czochralski method is sliced to obtain thin disk-like wafers; chamfering process in which the edges of the periphery of the sliced wafer are chamfered to prevent from chipping and/or cracking; lapping process in which the main surface of the chamfered wafer is flattened; wet etching process in which the residual process damage layer due to chamfering and lapping is removed; mirror-polishing process in which the main surface and the chamfered portion of the etched wafer is mirror-polished; and cleaning process in which polishing agent and foreign matter remaining on the polished wafer are removed to secure good cleanliness.

A variety of developments have been made to attain improvement concerning quality items in these processes such as flatness, surface roughness, and particles. For example, methods to reduce waviness in slicing process are disclosed in Japanese Patent Application No. Hei6-227291 and published Unexamined Japanese Patent Application No. Hei9-248758, and a method to improve flatness and productivity of a wafer of large diameter is disclosed in published Unexamined Japanese Patent Application No. Hei9-26314.

In the present invention, as the standard method of processing wafer is adopted a stable manufacturing method which combines effectively these recent outcomes of development and thus obtained wafer which bear practical use as a wafer of high quality specification are used as standard wafer.

Further, in the present invention, in the cleaning process which is the final process, cleaning with ammonia based cleaning solution only or concurrently with other agent or agents is unfailingly performed because, although acidic or alkaline agent, or so-called function water such as ozone water, electrolytic ion water, and hydrogen water can be considered as cleaning agent, may whichever be adopted, it has been found in the present invention that particularly the performance of cleaning with ammonia based cleaning solution is the best way to reduce particles including organic foreign matter.

About crystal pulling process which is a source of generation of particles, technology has reached a high level also in the domain of crystal growth in an ingot of 200 mm diameter currently used generally, with factors cleared in the Czochralski method; factors such as the structure of the hot zone, the relation between crystal quality and temperature gradient of relating melt and rod, the relation between crystal quality and restraint of convection, and the relation between crystal quality and the material of crucible, and the influence of rotation speed of crystal and crucible to crystal quality.

Further, the technology for producing a crystal ingot of larger diameter has been developed lying fundamentally on a direct extension of the current technology, and with increased dimension of the ingot the problem of heat transfer, material, and method to support heavy crystal ingot are the subject to be challenged for improvement and development.

As described later, in the case of the comparative example a silicon ingot produced by the conventional method developed up to the present was used and the result showed that the target was not necessarily attained.

For this reason, a study of manufacturing conditions of a wafer of a diameter of 300 mm was specifically performed in every way and a wafer of large diameter with reduced particles to the level of the object have been obtained.

By appropriate selection of not only conditions of factors relating to the temperature of and its distribution in the single-crystal, factors such as conditions of crystal growth (conditions of pulling, temperature of and convection in the melt), construction of the furnace, condition of gas flow in the gas phase, but also conditions in thermal history in the cooling process of the crystal and heat treatment in the process afterward to the last where finished wafer is obtained, the reduction of particles on the surface of a wafer to the level aimed at by the present invention can be possible and these methods can be applied to a wafer of diameter of 300 mm and larger.

From the viewpoint of the fact mentioned above, in the present invention, the number of particles ascribable to crystal is reduced to the limit by improving mainly the pulling condition in the Czochralski method, specifically by pulling a single-crystal silicon crystal of diameter of 300 mm and larger with low speed of 0.4 mm/min and lower.

Therefore, the present invention offers a practical, large diameter wafer with the most small number of total particles, by combining the single-crystal silicon produced by the method mentioned above with the current-level technology of controlling particles due to the processing of wafer and the process of cleaning with ammonia based cleaning solution.

Further, according to the inventors findings, it is coming out to be clear that generating mechanism of defects in the crystal is controlled by intentionally doping non-metal elements such as, for example, B, C, and N, when the single-crystal is pulled and as a result the number of defects are reduced.

The technology as mentioned above is also effective for reduction of particles.

It is found that, even if the condition of pulling the crystal is the same, the dopant concentration in the melt is influential to the number of particles ascribable to crystal.

For example, in the case the concentration of Boron as a dopant is high and the specific resistance of the crystal is low, the number of particles due to crystal is smaller than in the case with low concentration Boron doping and with the same condition of pulling the crystal. With an ingot with high concentration of dopant, for example, with a $P^+$item (specific resistance 0.01–0.02 $\Omega \cdot cm$), the result reaches the range to clear the condition of the present invention.

In the process of producing a single-crystal silicon ingot, single-crystal is grown from silicon melt. Melting temperature of silicon is 1420 ° C. and at the end of crystal growth the silicon is cooled to room temperature. So the silicon undergoes a wide range of thermal history.

When the single-crystal silicon is high in temperature there exist vacancies and interstitial silicon atoms in a state of thermal equilibrium. It is thought that, in the process of single-crystal growth of silicon, or to put it another way, in the cooling process, as the temperature of the single-crystal decreases, excess vacancies and interstitial silicon atoms undergo pair annihilation and agglomeration, and as a result particles ascribed to crystal are formed.

Therefore, by lowering the growth rate of single-crystal silicon the period of thermal history is prolonged, pair annihilation of vacancies and interstitial silicon atoms advances, and as a result defects which become nuclei of particles ascribable to crystal can be decreased.

In addition, elements of impurities in the silicon have relation to the pair annihilation and agglomeration of vacancies and interstitial silicon atoms, and a proper combination of addition of some kind of elements, conditions of thermal history, and heat treatment afterward can also decrease particles due to crystal.

As explained heretofore, by using single-crystal silicon wafers of the present invention, the yield rate in the process of making semiconductor device is improved and wafers which show excellent oxide film dielectric breakdown characteristic (TZDB: Time Zero Dielectric Breakdown) which is extremely important quality characteristic of semiconductor device are obtained.

In addition, the wafer can be used as the best suited single-crystal silicon wafer for the process monitor for controlling particle level in a semiconductor device manufacturing equipment.

Figure 1:
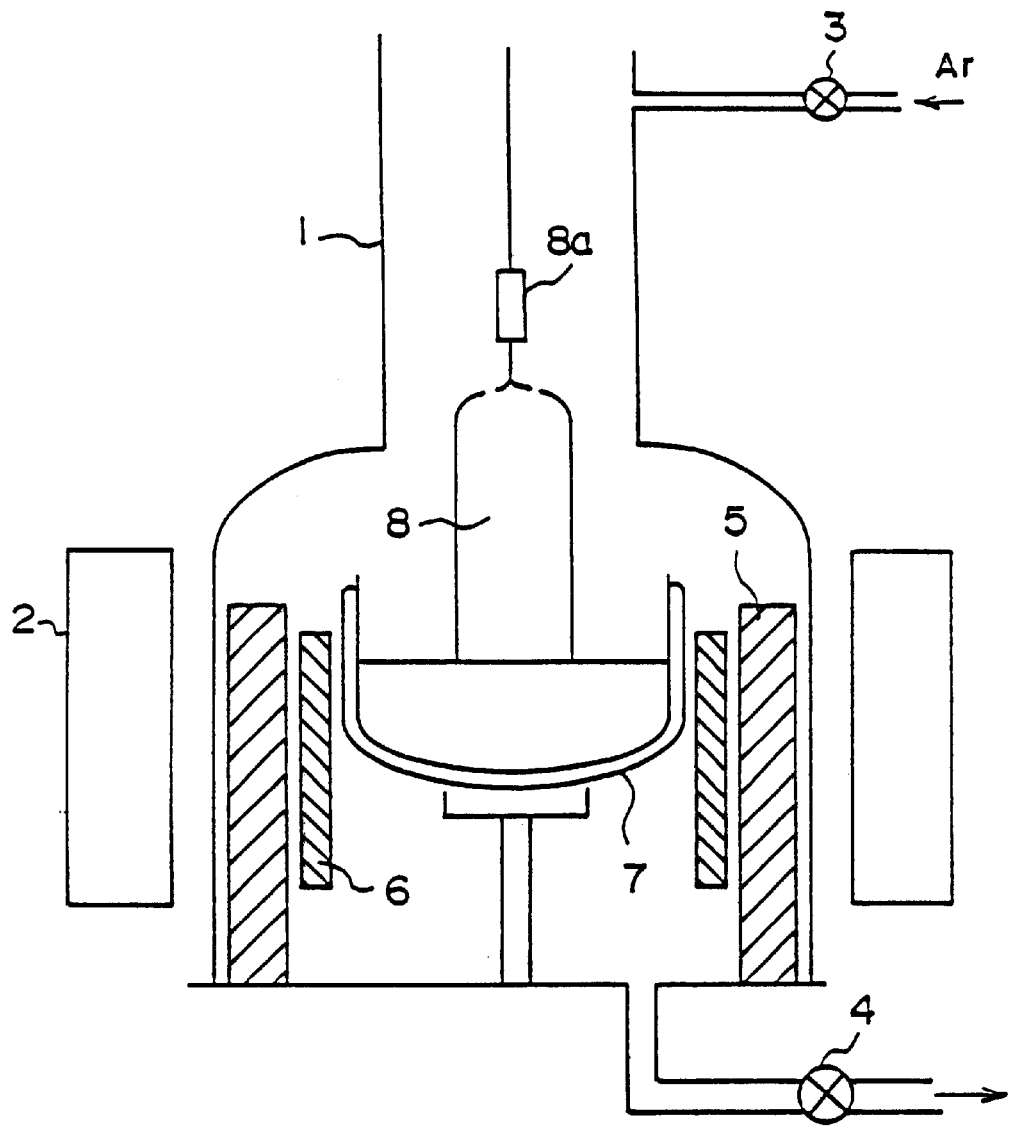
FIG. 1 is a diagrammatic sketch of a single-crystal producing apparatus of the present invention.

In the drawings reference numeral 1 denotes pulling chamber, 2 superconducting magnet coil, 5 resistance heater, 6 heat shield, and 7 quartz crucible.

DETAILED DESCRIPTION OF THE PREFERRED EMBODIMENT

A preferred embodiment of the present invention will now be detailed with reference to the accompanying drawings. It is intended, however, that dimensions, materials and shapes of the constituent, relative positions thereof and the like in the following description and in the drawings shall be interpreted as illustrative only not as limitative of the scope of the present invention.

Standard Processing Method

Following processing of wafers after pulling process was performed as an example of the embodiment of standard processing method for making possible the comparison under the same condition.

(1) Slicing process: the silicon wafer of a thickness of about 1 mm was sliced from the single-crystal silicon ingot of a length of 25 cm with a multi-wire saw spending 15 hours.

(2) Chamfering process: edges of the wafer were ground in full round shape with edge grinder for 2 rotations.

(3) Lapping process: both surfaces were lapped with a lapper to a stock removal of 150 $\mu$m to flatten the microscopic unevenness on the surface generated in the slicing process.

(4) Etching process: both surfaces were etched with alkaline (caustic soda) etchant to a stock removal of 20 $\mu$m and damaged layers generated on the surfaces of the wafer were removed.

(5) Polishing process: both surfaces were polished by a stock removal of 25 $\mu$m by the DSP (Double Side Polishing) method to mirror-finish both sides.

(6) Cleaning process: ammonia based cleaning, so-called SC-1 cleaning described in Semiconductor International, April 1984, p.94 was performed at 78 ° C. for 90 seconds and the wafer was dried by heating with infrared rays keeping the cleanliness.

Processing of examples of the wafer described later was performed by this standard method and number of particles of each example was compared.

Single-crystal Producing Procedure

FIG. 1 is a diagrammatic sketch of a single-crystal producing apparatus of the present invention.

In FIG. 1, 1 is a pulling chamber made of stainless steel, 2 is a superconducting magnet coil which is placed surrounding the periphery of said chamber in which a quartz crucible 7 is mounted, and said superconducting magnet coil 2 applies horizontal magnet field to the melted polysilicon in said quartz crucible 7. 3 is an inflow regulating valve through which argon gas is introduced into said chamber 1 and 4 is an outflow regulating valve through which said argon gas is exhausted from said chamber 1. 5 is a resistance heater surrounding said quartz crucible 7 and 6 is a heat shield for thermal insulation.

Example 1 and 2

Polysilicon of 210 kg was charged in the quartz crucible 7 of diameter of 71 cm, said polysilicon was heated to be melted by a resistance heater 5, boron is doped to regulate the specific resistance to 10 $\Omega$·cm. Then, a seed crystal 8a with crystal orientation of (100) was immersed in the surface zone of the silicon melt and rotated with a rotation speed of 8 rpm, said quartz crucible 7 was rotated with a rotation speed of 1 rpm in the direction counter to that of said seed crystal, and a single-crystal silicon 8 of a diameter of 300 mm with predetermined crystal orientation was grown, in which the growth rate of the single-crystal 8 at the constant diameter part was controlled to 0.4 mm/min.~0.35 mm/mn.

From thus produced single-crystal silicon ingot were sliced silicon wafers of a thickness of about 1 mm in accordance with the standard processing method described before with a wire saw, then after lapping, etching, and mirror-polishing, ammonia based cleaning (SC-1, Semiconductor International, April 1984, p.94) was performed to remove foreign matter and organic substances adhered in the mirror-polishing process, thereafter each number of particles in 4 ranges: ①; equal to or larger than 0.083 $\mu$m in size, ②; equal to or larger than 0.090 $\mu$m, ③; equal to or larger than 0.100 $\mu$m, and ④; equal to or larger than 0.120 $\mu$m was measured by an optical particle counter.

Figure 2:
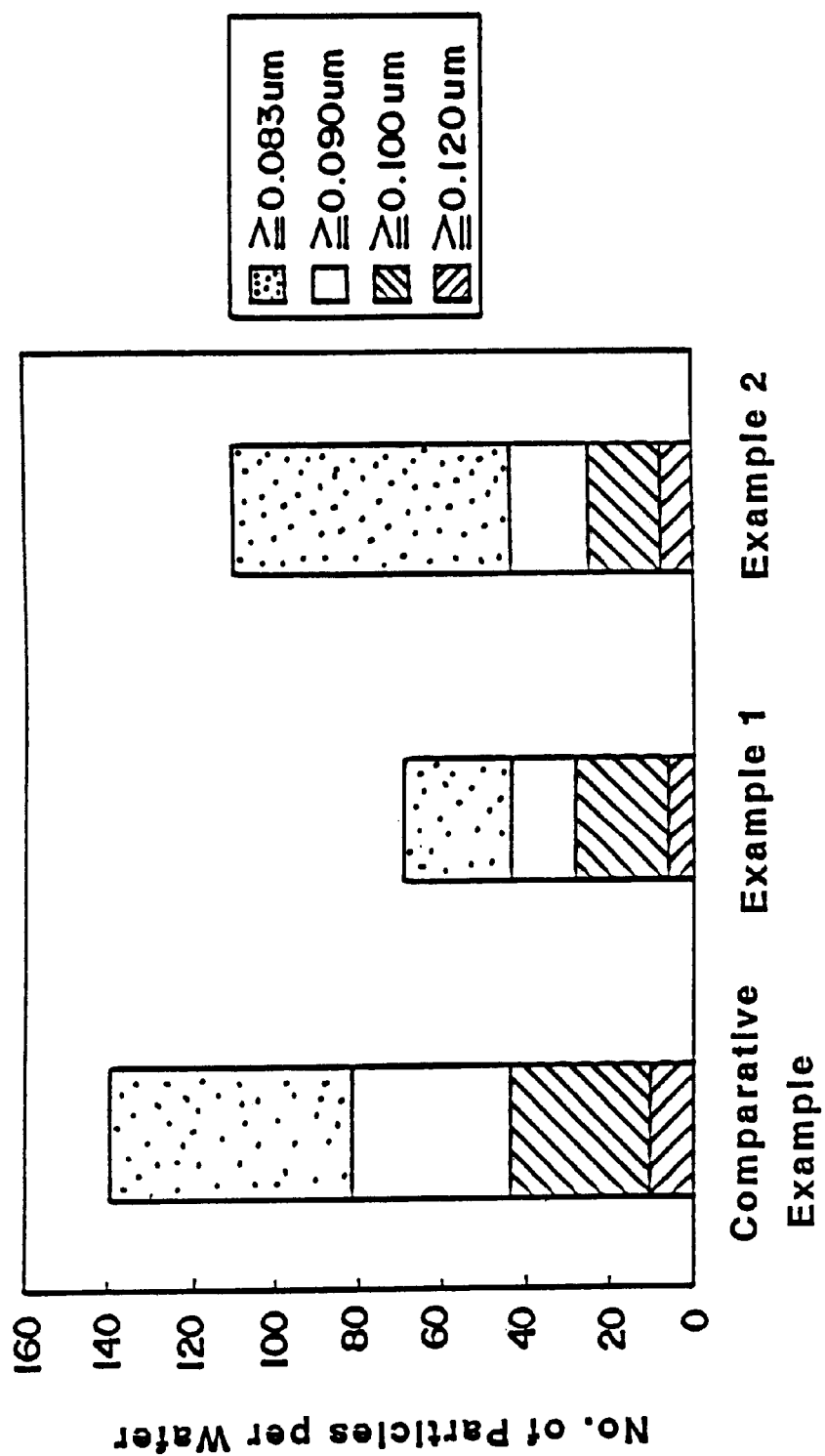
FIG. 2 is a graph showing results of measurement of the number of particles of the first and second example of wafers by the present invention and a comparative example.

In FIG. 2 is shown the result of particle measurement of the wafer of example 1 according to the present invention and in this case the number of particles equal to or larger than 0.090 $\mu$m in size is 43 and that of particles equal to or larger than 0.083 $\mu$m is 70. Thus a single-crystal silicon wafer of diameter of 300 mm with very low number of particles was obtained.

The example 2 according to the present invention was processed from the ingot which is produced with a crystal growth rate of 0.45–0.55 mm/min and Boron is added to high concentration so that the specific resistance is 0.01~0.02 $\Omega$·cm, the result of particle measurement is shown also in FIG. 2, and in this case the number of particles equal to or larger than 0.090 $\mu$m in size is 43 and that of particles equal to or larger than 0.083 $\mu$m is 110 which is smaller than the quality target of 120 and thus a single-crystal silicon wafer of diameter of 300 mm with very low number of particles was obtained also with the example 2.

Therefore, it is understood that a single-crystal silicon wafer of a diameter of 300 mm with low number of particles clearing the quality target was obtained with said example 1 or 2.

Comparative Example

On the other hand, the number of particles of a single-crystal silicon wafer of a diameter of 300 mm obtained by the conventional technology was measured for comparative example, the result is also shown in FIG. 2, and the number of particles equal to or larger than 0.083 $\mu$m in size is in the neighborhood of 140 which largely exceeds the target limit of 120 and even that of particles equal to or larger than 0.090 $\mu$m is over 80, so the quality target can not be attained.

Before cleaning, some wafers which are processed in the same way as wafers of example 1 before cleaning were extracted and cleaned with ozone water as rinsing liquid X, and the result of measurement (not shown in the drawings) of the number of particles equal to or larger than 0.090 $\mu$m in size is 90 and that of particles equal to or larger than 0.083 $\mu$m is 130, which exceed the established range of the present invention and the quality target is not attained.

What is claimed is:

1. A single-crystal silicon wafer of diameter equal to or larger than 300 mm for a semiconductor device to be fabricated with design rules equal to or smaller than 0.18 $\mu$m, wherein, concerning particles detected on a flat mirror-surface, a number of the particles equal to or larger than 0.083 $\mu$m in size is equal to or smaller than 120, and a number of the particles equal to or larger than 0.09 $\mu$m in size is equal to or smaller than 80.

2. A single-crystal silicon wafer according to claim 1, wherein said single-crystal silicon wafer is a wafer of which specific resistance is adjusted to be equal to or larger than 0.01 $\Omega\cdot$cm.

3. A single-crystal wafer according to claim 1, wherein said single-crystal silicon wafer is a wafer of which specific resistance is adjusted to be equal to or larger than 0.01 $\Omega\cdot$cm by addition of doping agent boron.

4. A single-crystal silicon wafer of diameter equal to or larger than 300 mm produced by CZ method for a semiconductor device to be fabricated with design rules equal to or smaller than 0.18 $\mu$m, wherein a mirror-surfaced single-crystal silicon wafer of diameter equal to or larger than 300 mm is obtained from a single-crystal silicon pulled up with crystal growth rate equal to or lower than 0.4 mm/min in a constant diameter part, and after cleaned with ammonia based rinse, the number of particles equal to or larger than 0.083 $\mu$m in size detected on a mirror-like flat surface is equal to or smaller than 120 and the number of particles equal to or larger than 0.09 $\mu$m is equal to or smaller than 80.

5. A single-crystal silicon wafer according to claim 4, wherein the single-crystal silicon is pulled up with the crystal growth rate equal to or lower than 0.4 mm/min in the constant diameter part while applying a horizontal magnetic field to melted polysilicon in a quartz crucible.

6. A single-crystal silicon wafer according to claim 4, wherein the single-crystal silicon pulled up with the crystal growth rate equal to or lower than 0.4 mm/min in the constant diameter part while rotating a seed crystal in a rotational direction opposite to that of a quartz crucible.

* * * * *